United States Patent [19]

Fay et al.

[11] Patent Number: 4,703,390
[45] Date of Patent: Oct. 27, 1987

[54] INTEGRATED CIRCUIT POWER TIMER

[75] Inventors: Gary Fay, Scottsdale; Jeffrey G. Mansmann, Chandler; Keith M. Wellnitz, Scottsdale, all of Ariz.

[73] Assignee: Motorola, Inc., Schaumburg, Ill.

[21] Appl. No.: 866,805

[22] Filed: May 27, 1986

[51] Int. Cl.[4] .................. H02H 3/093; H02H 3/10
[52] U.S. Cl. ..................... 361/101; 361/98; 361/18; 361/103; 323/277
[58] Field of Search ............. 361/18, 86, 87, 93, 361/98, 101, 103; 323/268, 269, 273, 274, 275, 276, 277

[56] References Cited
U.S. PATENT DOCUMENTS

| | | | |
|---|---|---|---|
| 3,480,852 | 11/1969 | Hung | 361/93 |
| 4,021,701 | 5/1977 | Davies | 361/18 |
| 4,404,473 | 9/1983 | Fox | 361/93 X |
| 4,429,339 | 12/1984 | Jaeschke | 361/93 |
| 4,493,002 | 1/1985 | Pelowski | 361/93 |

Primary Examiner—A. D. Pellinen
Assistant Examiner—H. L. Williams
Attorney, Agent, or Firm—Joe E. Barbee

[57] ABSTRACT

An integrated circuit power timer having a power field effect transistor and a versatile timing circuit all on one integrated circuit is provided. The integrated circuit has built in thermal and current limit protection and provides a fault indicator in case of an over current or an over temperature condition.

6 Claims, 1 Drawing Figure

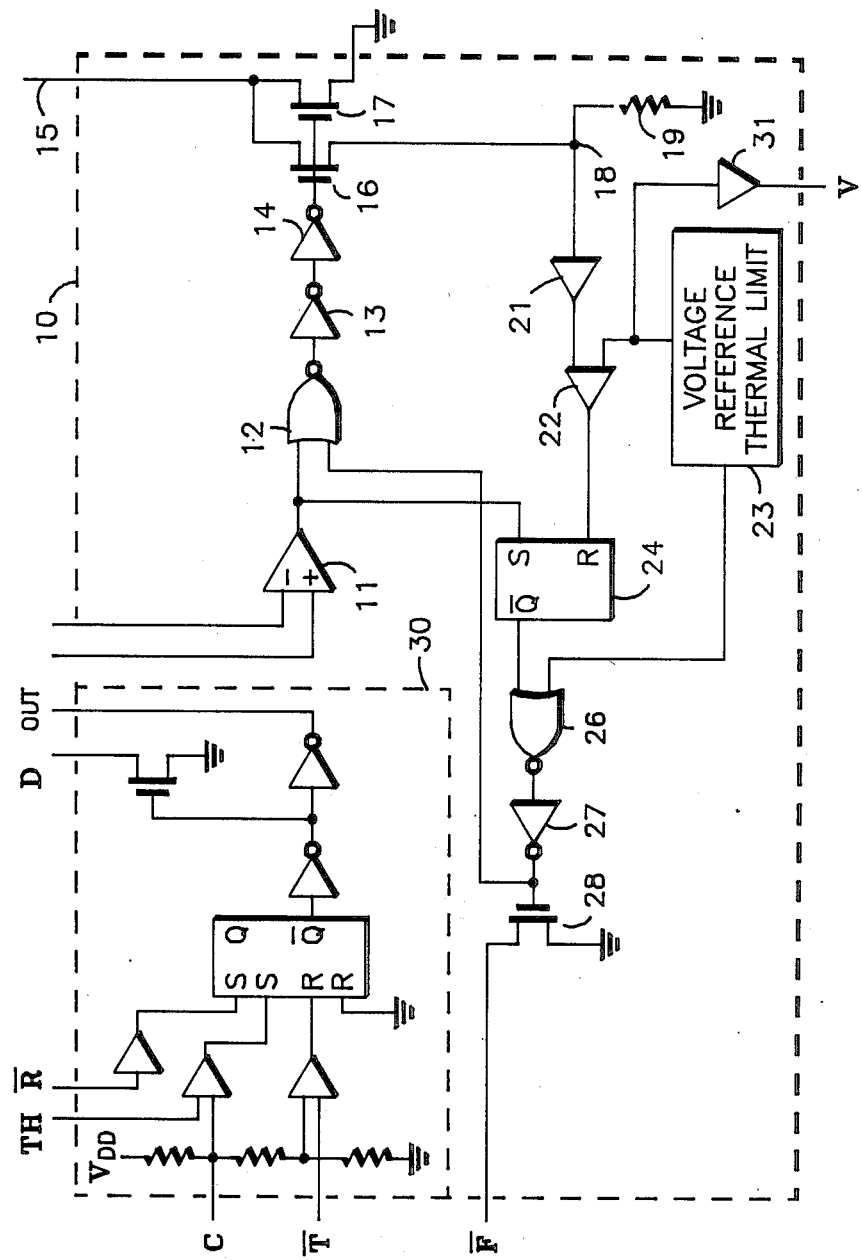

INTEGRATED CIRCUIT POWER TIMER

CROSS REFERENCE TO RELATED APPLICATION

This application contains subject matter which is common to subject matter disclosed in patent application Ser. No. 866,802 filed concurrently herewith.

BACKGROUND OF THE INVENTION

This invention relates, in general, to semiconductor integrated circuits, and more particularly, to an integrated circuit power timer.

It is often desirable to vary the duty cycle of a switch controlling power to a load. The load can be any desirable device such as an electric motor, or an electric light. Various techniques have been used in the past to control power to such devices. However, it would be desirable to have a small, one package power device for performing such a switching function. Such a control circuit should include a high voltage, high current transistor with control and protection circuits which can all be made with one compatible manufacturing process.

Accordingly, it is an object of the present invention to provide an improved integrated circuit power timer.

Another object of the present invention is to provide an integrated circuit having a power output transistor along with control and protection circuitry all on one chip.

Yet a further object of the present invention is to provide an integrated circuit power timer which is capable of providing a variety of switching functions such as, pulse width variations, frequency variations, and duty cycles.

Yet another further object of the present invention is to provide an integrated circuit power timer which is in one package, and which provides power device protection and load fault diagnostics.

SUMMARY OF THE INVENTION

The above and other objects and advantages of the present invention are provided by a single integrated circuit chip having a power field effect transistor to controllably switch power to a load. A second field effect transistor is connected in parallel with the first field effect transistor in order to sample a portion of the current flowing through the load. The sampled current is amplified and compared to a voltage reference. If the sampled current exceeds the voltage reference an inhibiting signal is sent to control circuitry which controls the power field effect transistor. Thermal limit circuitry is also included on the single integrated circuit chip to monitor the temperature of the chip. Since the power transistor is made as a portion of the chip and is the largest device on the chip the temperature of the chip will reflect the junction temperature of the power transistor. A standard timing circuit is also provided on the single integrated circuit chip so that the control circuitry that controls the power field effect transistor can be controlled by the timing circuitry thereby resulting in a versatile and easily adjustable power switch.

The subject matter which is regarded as the invention is set forth in the appended claims. The invention itself, however, together with further objects and advantages thereof, may be better understood by referring to the following detailed description taken in conjunction with the accompanying drawing.

BRIEF DESCRIPTION OF THE DRAWING

The single FIGURE illustrates in block diagram form an embodiment of the present invention.

DETAILED DESCRIPTION OF THE DRAWING

The single FIGURE illustrates a power integrated circuit 10 which is capable of handling high voltages and currents on the order of 100 volts at 10 amps. Integrated circuit 10 has built in thermal and current limits in addition to a versatile timer 30.

Input control signals are connected to the inverting and non-inverting inputs of a comparator 11. The command signals on the inputs to comparator 11 will control the output power operation of integrated circuit power timer 10. As an example circuit 10 can provide an output that would be comparable to a one shot, pulse width modulated outputs, outputs to control motor speed, and light dimming or flashing lights control. The type of output control achievable depends upon the inputs to comparator 11 and the types of signals used for these inputs. These inputs can be obtained from timer 30 and from output V from amplifier 31.

The output of comparator 11 is connected to an input of a dual input NOR gate 12. The output of NOR gate 12 is connected to an input of inverter 13 which has an output connected to an input of an inverter 14. The output of inverter 14 is connected to the gate electrodes of transistors 16 and 17. Inverters 13 and 14 serve as a buffer driver for the gate electrodes of field effect transistors 16 and 17 to enable these transistors. Transistors 16 and 17 have their drain electrodes connected together and going to an output 15. Output 15 is an open drain output which would be connected to a load. The load would be connected between terminal 15 and a power supply. The source of transistor 17 is connected to ground and is illustrated as being connected to ground outside of integrated circuit 10. The source of transistor 16 is connected to a node 18. Although field effect transistor 17 is illustrated as a single transistor in a typical power MOS transistor arrangement would comprise approximately 1500 cells or single transistors all connected in parallel whereas field effect transistor 16 would be only one such transistor.

Node 18 is coupled to ground by a resistor 19 which establishes a sensing voltage proportional to the current flowing through sensing transistor 16. Node 18 is also connected to an input of an operational amplifier 21 to provide an amplified sense current signal. This amplified sense current signal is connected to an input of a comparator 22. Comparator 22 compares this amplified sense current signal to a reference voltage supplied by reference voltage generator 23. In a preferred embodiment, reference voltage generator 23 is a bandgap reference generator. In a preferred embodiment node 18 is brought out to an interface pin of integrated circuit 10 to allow the user of the circuit to add an additional resistor to change the trip point of the over current limit signal. In addition, this interface pin will allow the current to be monitored.

A thermal limit circuit is illustrated as being a portion of voltage reference generator 23. The thermal limit circuit senses the temperature of integrated circuit chip 10 and provides an output if the temperature exceeds a predetermined value. Thermal limit circuits are well known to those skilled in the art. The thermal limit circuit requires a stable voltage which is independent of temperature variations. The bandgap reference generator provides such a voltage. Since power field effect transistor 17 is the largest device on the die the temperature sensed by the thermal limit circuit will reflect approximately the junction temperature of transistor 17. In a preferred embodiment where voltage reference generator 23 is a bandgap voltage generator the output going to comparator 22 is 1.2 volts. This 1.2 volts is also connected to an input of an amplifier 31 which supplies a current limited output voltage V which can be any convenient value as an example, 4.8 volts. Not only does amplifier 31 amplify the voltage to provide a temperature stable voltage but it also gives the reference voltage V an additional current capability without loading down the precise voltage reference 23.

The output of comparator 22 is connected to the reset input R of flip-flop 24. The $\bar{Q}$, which is a complementary output of flip-flop 24 is connected to one input of a dual input NOR gate 26. The second input of NOR gate 26 is connected to the output of thermal limit circuit 23. The output of NOR gate 26 is connected to an input of an inverter 27. The output of inverter 27 is connected to the gate electrode of a fault indicating field effect transistor 28 and to an input of a dual input NOR gate 12. The source electrode of field effect transistor 28 is connected to ground and the drain provides an open drain fault indication $\bar{F}$. The output of comparator 11 is connected to the set S input of flip-flop 24 to reset flip-flop 24 once an over current condition has been corrected. Every cycle flip-flop 24 is set by the output from comparator 11 and is reset if an over current condition exists. The output of inverter 27 which is connected to the input of NOR gate 12 serves to inhibit NOR gate 12 thereby preventing an enabling signal from being provided to the gate electrodes of transistors 16 and 17.

Timer 30 can be any suitable timing circuit which can be made with CMOS processes in order to keep the process compatible throughout the entire integrated circuit 10. In a preferred embodiment, timer 30 is a standard timing circuit commonly referred to as a 555 timer. Such a part is available from Texas Instruments as a TLC555C or from Intersil as an ICM7555. As an example, the T input of timer 30 is a trigger input, the C input is a control input, the TH input is the threshold input, and the R input is the reset input, and D is connected to the drain of the open drain discharge device. It should also be noted that in a preferred embodiment, VDD for the resistive voltage divider of timer 30 is brought out to an interface pin of integrated circuit 10 to permit the voltage divider to be powered from a power source different from that powering integrated circuit 10, such as a TTL compatible power source.

By now it should be appreciated that there has been provided a power integrated circuit having an undedicated comparator 11 controlling the power transistor and on chip thermal and current limits along with a fault indicator. In addition, a CMOS version of the 555 timer is built on the same integrated circuit to provide versatile control and operation of the integrated circuit.

We claim:

1. An integrated circuit power timer comprising: a power field effect transistor switching means for controllably switching power to a load; a current sensing field effect transistor means used for sensing current flowing through the load; an amplifier for amplifying the sensed current; a first comparator for comparing the amplified sensed current to a reference voltage and providing an output when the amplified sensed current exceeds the reference voltage; a bandgap voltage reference generator for providing the reference voltage; a thermal limit circuit for sensing the temperature of the integrated circuit and providing an output when the temperature exceeds a predetermined value; first logic means coupled to the first comparator and to the thermal limit circuit for providing an inhibiting output when the thermal limit circuit or the first comparator provides an output; a timing circuit for providing a timing signal output; a second comparator for comparing the timing signal output against a predetermined voltage reference and providing an output when the timing signal output is at a predetermined level with respect to the predetermined reference; second logic means for receiving the inhibiting output and the output of the second comparator and providing an output in response to the output of the second comparator in the absence of the inhibiting output; and buffer driver means for providing a driving signal to the power field effect transistor switching means and to the current sensing field effect transistor means in response to the output of the second logic means.

2. The integrated circuit power timer of claim 1 further including means for amplifying the reference voltage to provide the predetermined voltage reference to the second comparator.

3. The integrated circuit power timer of claim 1 wherein the first logic means includes a flip-flop having its reset input coupled to the output of the first comparator, its set input coupled to the output of the second comparator; and a logic gate having a first input coupled to a complementary output of the flip-flop and a second input coupled to the output of the thermal limit circuit.

4. An integrated circuit power switch for controllably switching power to a load by switching a power field effect transistor, comprising: a field effect transistor in parallel with the power field effect transistor to help sense current flowing through the load; first means for providing an output when the current flowing through the load exceeds a predetermined value; second means for monitoring temperature of the integrated circuit and providing an output when the temperature exceeds a predetermined value; first logic means for receiving the output from the first and second means and providing an inhibiting signal when one of the outputs from the first and second means is present; input means for receiving an external input and providing an output in response to the input; second logic means for receiving the output from the input means and for receiving the inhibiting signal and providing an output in response to the output from the input means in the absence of the inhibiting signal; and third means coupled to the output of the second logic means for providing an enabling signal to the power field effect transistor.

5. The integrated circuit power switch of claim 4 further including a timer circuit for generating an output signal for use by the input means.

6. The integrated circuit of claim 4 further including means for providing a fault indication having an input for receiving the inhibiting signal and generating the fault indication therefrom.

* * * * *